(12) United States Patent
Hirai et al.

(10) Patent No.: US 6,737,890 B2
(45) Date of Patent: *May 18, 2004

(54) SWITCHING CIRCUIT DEVICE (75) Inventors: Toshikazu Hirai, Ora-gun (JP); Tetsuro Asano, Ora-gun (JP)

(73) Assignee: Sanyo Electric Co., Ltd., Osaka (JP)

(*) Notice: Subject to any disclaimer, the term of this patent is extended or adjusted under 35 U.S.C. 154(b) by 45 days.

This patent is subject to a terminal disclaimer.

(21) Appl. No.: 10/073,363

(22) Filed: Feb. 13, 2002

(65) Prior Publication Data

US 2002/0118044 A1 Aug. 29, 2002

(30) Foreign Application Priority Data

Feb. 27, 2001 (JP) .................................. 2001-051861

(51) Int. Cl.[7] .............................................. H03K 17/693
(52) U.S. Cl. ........................ 326/112; 326/27; 326/113; 327/416
(58) Field of Search ......................... 326/18, 27, 69, 326/106, 107, 108, 112, 113; 327/416

(56) References Cited

U.S. PATENT DOCUMENTS

| 4,810,911 A | * | 3/1989 | Noguchi ..................... 307/571 |
| 5,350,957 A | | 9/1994 | Cooper et al. |
| 5,497,118 A | * | 3/1996 | Ueno et al. .................. 327/416 |
| 2002/0117696 A1 | * | 8/2002 | Hirai et al. .................. 257/280 |
| 2002/0118044 A1 | | 8/2002 | Hirai et al. |

* cited by examiner

*Primary Examiner*—Daniel D. Chang
(74) *Attorney, Agent, or Firm*—Morrison & Foerster, LLP

(57) ABSTRACT

A switching circuit device has a first FET and a second FET, and operates with single control terminal. The device also has a common input terminal connected to the drain or source electrode of the two FETs, a first output terminal and a second output terminal connected to the source or the drain electrode of the respective FET, a bias element applying an bias to the first output terminal, a first connection connecting the control terminal to the second FET, a second connection connecting the gate of the second FET to the ground, and a direct current isolation element placed between the two FETs.

15 Claims, 9 Drawing Sheets

FIG.1A

PRIOR ART

FIG.1B

PRIOR ART

SWITCHING CIRCUIT DEVICE

BACKGROUND OF THE INVENTION

1. Field of the Invention

The invention relates to a semiconductor switching device for switching at high frequencies, especially to a compound semiconductor switching device operating with only one control terminal.

2. Description of the Related Art

Mobile communication devices such as mobile telephones often utilize microwaves in the GHz range, and commonly need switching devices for high frequency signals which are used in switching circuits for changing antennas and switching circuits for transmitting and receiving such signals. A typical example of such a switching device can be found in Japanese Laid-Open Patent Application No. Hei 9-181642. Such a device often uses a field-effect transistor (called FET hereinafter) made on a gallium arsenide (GaAs) substrate, as this material is suitable for use at high frequencies, and developments have been made in forming a monolithic microwave integrated circuit (MMIC) by integrating the aforementioned switching circuits.

Figure 1A:
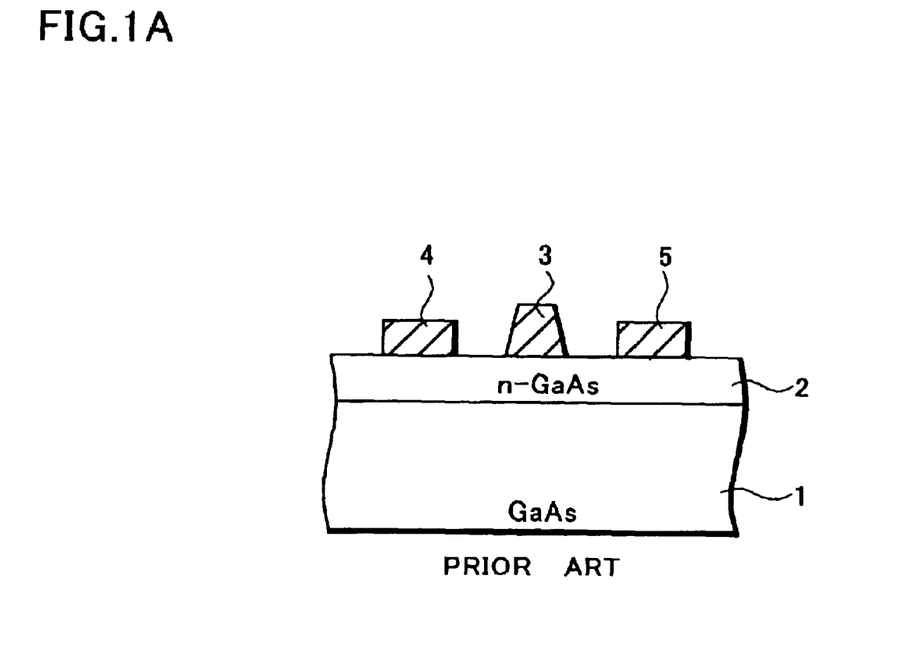
FIG. 1A is a cross-sectional view of a conventional switching device.

FIG. 1A is a cross-sectional view of a conventional GaAs metal-semiconductor field-effect transistor (MESFET). The GaAs substrate 1 is initially without doping, and has beneath its surface an n-type channel region (or a channel layer) 2 formed by doping with n-type dopants. A gate electrode 3 is placed on the surface of the channel region 2, forming a Schottky contact, and a source electrode 4 and a drain electrode 5 are placed on both sides of the gate electrode 3, forming ohmic contacts to the surface of the channel region 2. In this transistor configuration, a voltage applied to the gate electrode 3 creates a depletion layer within the channel region 2 beneath the gate electrode 3 and thus controls the channel current between the source electrode 4 and the drain electrode 5.

Figure 1B:
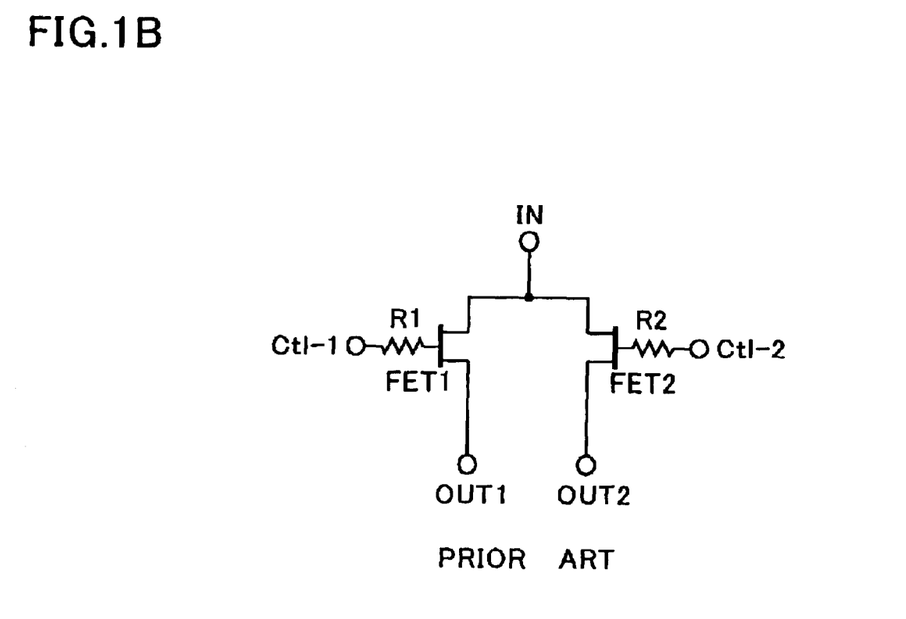
FIG. 1B is a circuit diagram of a conventional SPDT switch.

FIG. 1B shows the basic circuit configuration of a conventional compound semiconductor switching device called a SPDT (Single Pole Double Throw) switch, using GaAs FETs. The source electrode (or the drain electrode) of each FET (FET1 and FET2) is connected to a common input terminal IN. The drain electrode (or source electrode) of each FET (FET1 and FET2) is connected to respective output terminals (OUT1 and OUT2). The gates of FET1 and FET2 are connected to the control terminals Ctl-1, Ctl-2 through resistors R1, R2, respectively. A pair of complementary signals is applied to the two control terminals, Ctl-1, Ctl-2. When a high level signal is applied to the control terminal of one of the FETs, the FET changes to an on-state, and a signal fed to the common input terminal IN passes through the FET and reaches one of the output terminals OUT1, OUT2. The role of the resistors R1 and R2 is to prevent the leaking of the high frequency signals through the gate electrodes to the DC voltages applied to the control terminals Ctl-1, Ctl-2, which are substantially grounded at high frequency.

The conventional compound semiconductor switching device described above is configured so that one of the pair of complementary signal is applied to the gate of FET1 via the control terminal Ctl-1 and resistor R1 and other of the pair of complementary signal is applied to the gate of FET2 via the control terminal Ctl-2 and resistor R2. Accordingly, two signals, which forms a complementary signal pair, need to be fed to the two control terminals Ctl-1, Ctl-2. Such a configuration needs two external electrodes for the two control terminals Ctl-1, Ctl-2 when the device is housed in a package, resulting in a large package size. Although it is possible to eliminate one control terminal by introducing an inverter circuit to the switching device, this design requires additional FETs, resulting higher energy consumption and a larger package size.

Furthermore, the conventional GaAs MESFET is a depletion type FET and requires the application of a negative voltage for its operation. Therefore, the conventional compound semiconductor switching device described above requires a negative voltage generating circuit for its operation.

SUMMARY OF THE INVENTION

The semiconductor switching circuit device of this invention operates with only one control terminal without employing inverter circuits. The invention provides a switching circuit device including a common input terminal, a first output terminal and a second output terminal, a first switching element connected to the common input terminal and the first output terminal, a second switching element connected to the common input terminal and the second output terminal, and a control terminal connected to the first switching element and receiving a control signal for the switching device. The device also includes a first connection connecting the control terminal to the second switching element, a second connection connecting the second switching element to a ground, a bias element applying a bias voltage to the first switching element, and a direct current isolation element interrupting direct current between the first switching element and the common input terminal or between the second switching element and the common input terminal.

The invention further provides a semiconductor switching device including a first field effect transistor and a second field effect transistor each comprising a source electrode, a gate electrode and a drain electrode which are formed on a channel layer of the respective transistor. The device also includes a common input terminal connected to the source electrode or the drain electrode of the first and second transistors, a first output terminal connected to the source electrode or the drain electrode of the first transistor which is not connected to the common input terminal, a second output terminal connected to the source electrode or the drain electrode of the second transistor which is not connected to the common input terminal, and a control terminal connected to the gate electrode of the first transistor, which receives a control signal for the switching device. The device further includes a bias element applying a bias voltage to the source electrode or the drain electrode of the first transistor, a first connection connecting the control terminal to the source electrode or the drain electrode of the second transistor, a second connection connecting the gate electrode of the second transistor to a ground, and a direct current isolation element interrupting direct current between the first transistor and the common input terminal or between the second transistor element and the common input terminal.

The switching devices described above may have a predetermined positive voltage applied constantly to the source electrode or the drain electrode of the first transistor. The direct current isolation element may comprise a capacitor and the bias element may comprise a resistor and a power source. The capacitor, the resistor or the both may be integrated into a chip in which the switching elements are formed.

DETAILED DESCRIPTION OF THE INVENTION

Embodiments of this invention will be described hereinafter with reference to the drawings.

Figure 2:
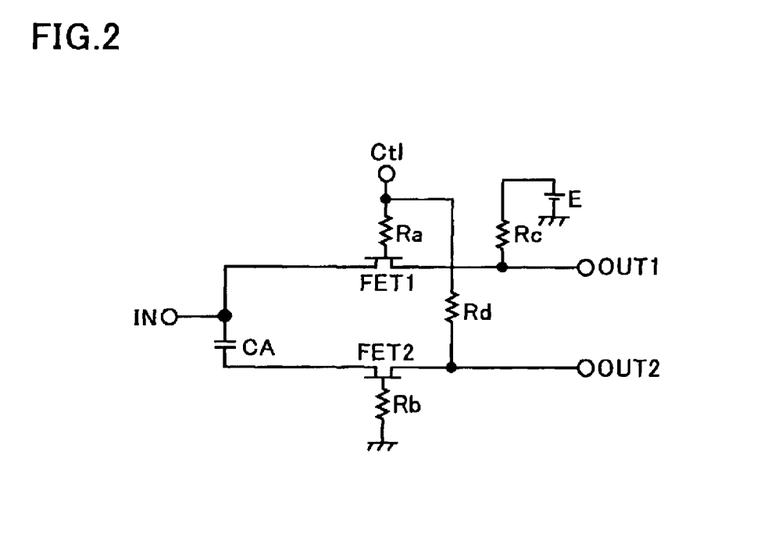
FIG. 2 is a circuit diagram of a semiconductor switching circuit device of a first embodiment of this invention.

FIG. 2 is a circuit diagram of a semiconductor switching circuit device of a first embodiment of the invention. The device has first and second FETs (FET1, FET2), each of which has a source electrode, a gate electrode and a drain electrode on its channel layer. The device also has a common input terminal IN connected to the source electrodes (or the drain electrodes) of the FETs (FET1, FET2), a first output terminal connected to the drain electrode (or the source electrode) of the first FET (FET1), a second output terminal connected to the drain electrode (or the source electrode) of the second FET (FET2), and a control terminal Ctl which supplies a control signal to the gate of only FET1. The device further includes a bias element applying a predetermined bias to the output terminal OUT1 of FET1 or to the input terminal IN, a direct current isolation element interrupting a direct current between the source electrode (or the drain electrode) of FET2 and the common input terminal IN, a first connection connecting the control terminal Ctl to the drain electrode (or the source electrode) of FET2, and a second connection connecting the gate electrode of FET2 to the ground. The two FETs are both GaAs MESFET and integrated into a chip, as described later with reference to FIGS. 7A and 7B.

The bias element, which includes a power source E and resistor Rc, constantly applies a predetermined positive voltage, for example +3V, to the output terminal OUT1 of FET1 via resistor Rc. The first connection includes resistor Rd, which connects the control terminal Ctl to the drain electrode (or the source electrode) of FET2. The second connection includes resistor Rb, which connects the gate electrode of FET2 to the ground. The isolation element is a capacitor CA, which is inserted between the common input terminal IN and the source electrode (or the drain electrode) of FET2. The isolation element isolates FET1 from FET2 in terms of direct current flow. Only one control terminal Ctl applies a control signal to the gate electrode of FET1 via resistor Ra. The four resistors Ra, Rb, Rc, Rd prevent leaking of high frequency signals from the gate electrodes and may have identical values or different values depending on circuit design.

Figure 3:
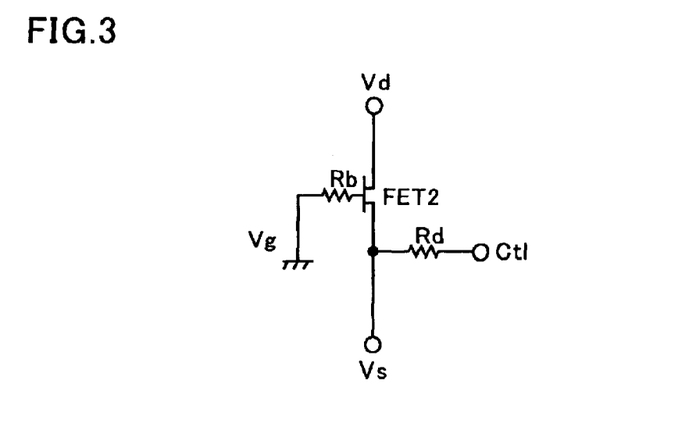
FIG. 3 is circuit diagram of FET2 of the circuit of FIG. 2.
Figure 4:
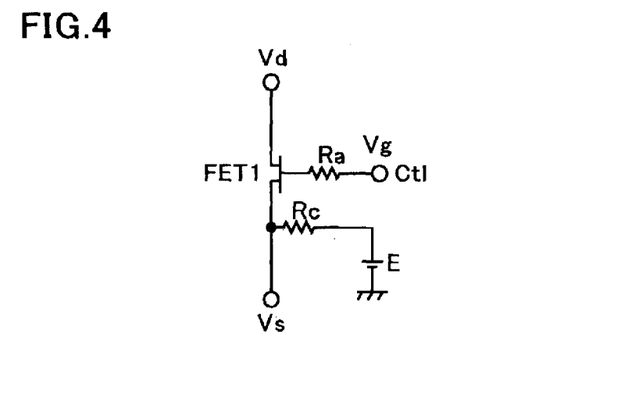
FIG. 4 is circuit diagram of FET1 of the circuit of FIG. 2.

FIGS. 3 and 4 show an operation principle of the switching circuit device of FIG. 2. For a SPDT switching device to operate with a single control terminal configuration, one of the two FETs must turn on while the other turns off under the application of a 0 V signal to the single control terminal. The term "0 V" refers to a baseline voltage as well known in the art. Likewise, when a positive signal is applied to the control terminal, the operation states of the two FETs alternate.

FIG. 3 depicts in greater detail FET2 of the circuit of FIG. 2. The gate voltage is kept constant at 0 V because the gate is grounded via resistor Rb. This FET turns on when the voltage applied between its gate and its drain (or source) is equal to the voltage applied between its gate and its source (or drain). In other words, Vg (gate voltage), Vd (drain voltage) and Vs (source voltage) must be the same. Because the gate is grounded (Vg=0 V), the bias condition for turning FET2 on is Vg=Vd=Vs=0 V. On the other hand, FET2 turns off when a voltage enough to turn it off is applied between the gate and the drain or between the gate and the source. Because the control terminal Ctl is connected to the drain electrode (or the source electrode) of FET2 via resistor Rd, FET2 turns on under an application of 0 volts to the control terminal Ctl and turns off under an application of a positive voltage, for example +3 V, to the control terminal Ctl.

FIG. 4 depicts in greater detail FET1 of the circuit of FIG. 2. Under an application of 0 V to the control terminal Ctl, FET1 turns off when a voltage enough to turn it off is applied between the gate and the drain as well as between the gate and the source. This is achieved by introducing a bias circuit which constantly applies a bias voltage to the drain (or the source) of FET1. On the other hand, FET1 turns on when a voltage equal to the bias voltage is applied to the gate of FET1. Accordingly, FET1 turns off under an application of 0 V to the control terminal Ctl, and turns on under an application of 3 V to the control terminal Ctl.

The circuits of FIGS. 3 and 4 are incorporated into the circuit of FIG. 2 with the capacitor CA isolating the circuit of FIG. 3 from the circuit of FIG. 4 in terms of direct current flow. Interrupting direct current flow between the circuits of FIGS. 3 and 4 prevents the interference between the bias conditions of the two circuits.

The features of the circuit of FIG. 2 are as follows:

1) The gate of one of the two FETs (FET2) of the switching device is grounded via resistor Rb.
2) The bias voltage applied to the FET (FET2) with the grounded gate is equal to the voltage applied to the control terminal connected to the gate of the other of the two FETs (FET1).
3) The bias voltage applied to the other FET (FET1) is constant at a predetermined value.
4) The two FETs (FET1 and FET2) are isolated from each other in terms of direct current flow by a capacitor.

Figure 5A:
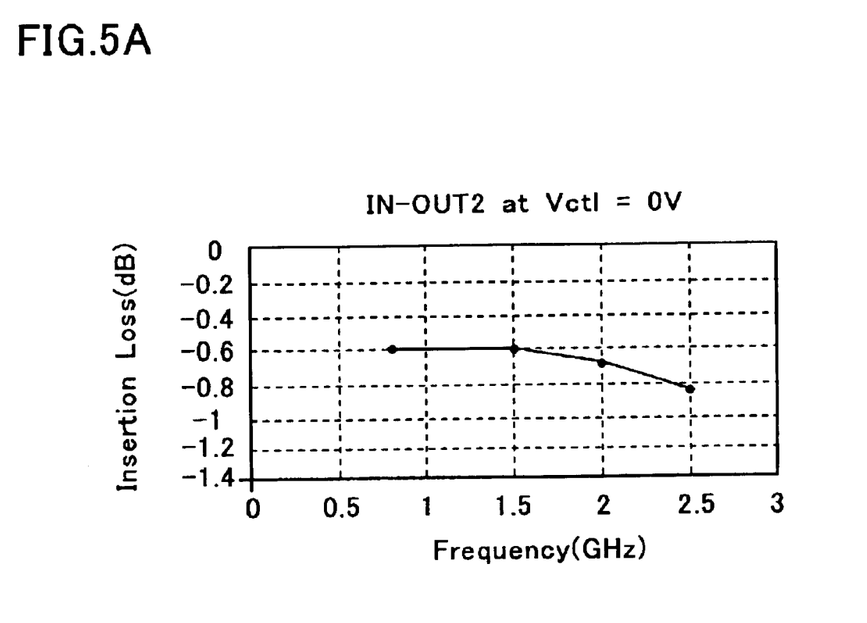
FIGS. 5A and 5B show the insertion loss (FET2) and the isolation (FET1) when 0 V is applied to the control terminal.
Figure 5B:
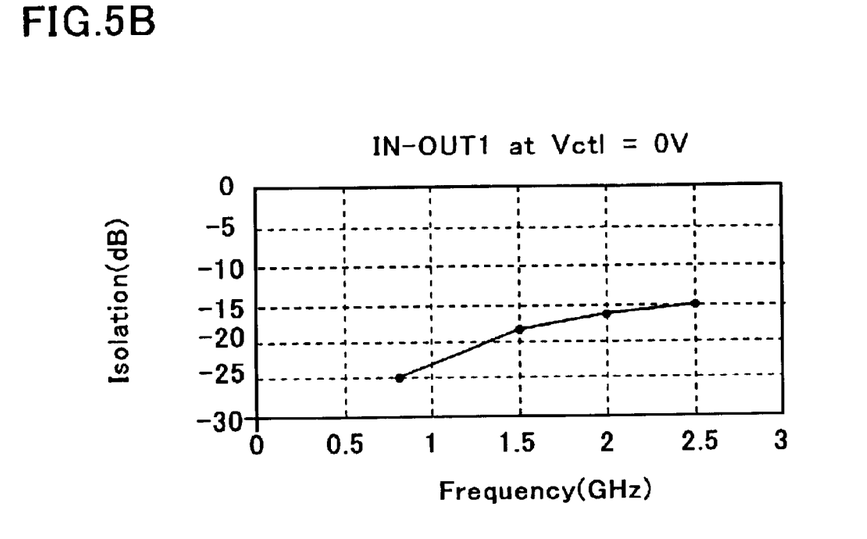

FIGS. 5A, 5B, 6A and 6B summarize the operational characteristics of the switching device based on the circuit of FIG. 2. FIGS. 5A and 5B show the device characteristics when FET2 is on and FET1 is off under an application of 0 V to the control terminal Ctl. The insertion loss between the common input terminal IN and the second output terminal OUT2 is shown in FIG. 5A, and the isolation between the common input terminal IN and the first output terminal OUT1 is shown in FIG. 5B. Both the insertion loss and the isolation are appropriate for the switching operation up to 2.5 GHz.

Figure 6A:
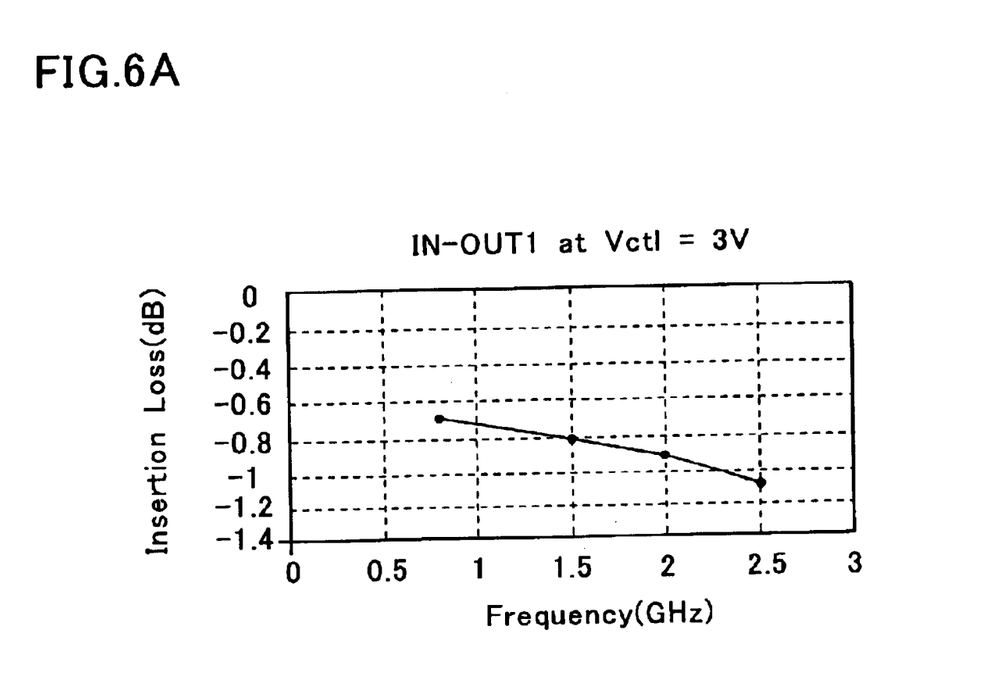
FIGS. 6A and 6B show the insertion loss (FET1) and the isolation (FET2) when 3 V is applied to the control terminal.
Figure 6B:
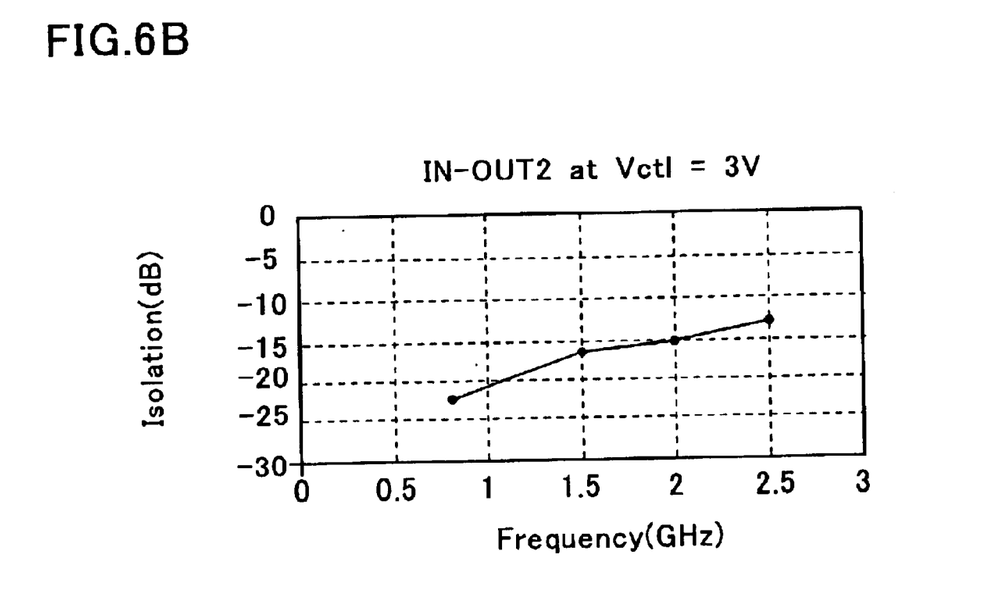

FIGS. 6A and 6B show the device characteristics when FET2 is off and FET1 is on under an application of +3 V to the control terminal Ctl. The insertion loss between the common input terminal IN and the first output terminal OUT1 is shown in FIG. 6A, and the isolation between the common input terminal IN and the second output terminal OUT2 is shown in FIG. 6B. Both the insertion loss and the isolation are appropriate for the switching operation up to 2.5 GHz.

Figure 7A:
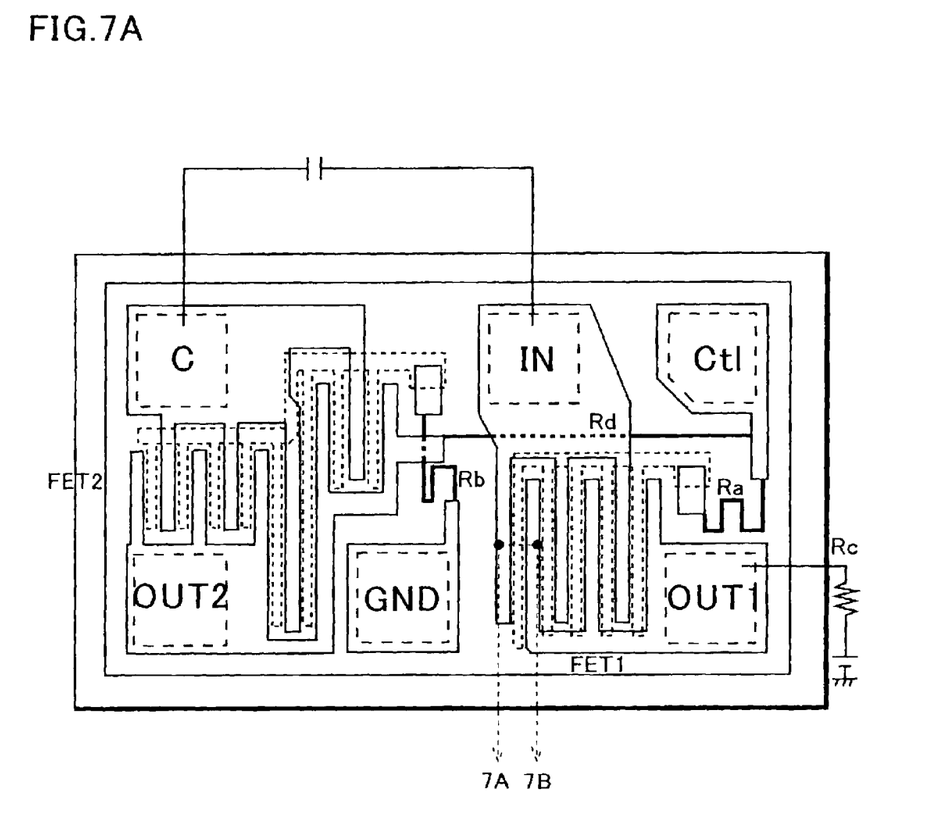
FIG. 7A is a plan view of a switching device integrated as a chip of the first embodiment.
Figure 7B:
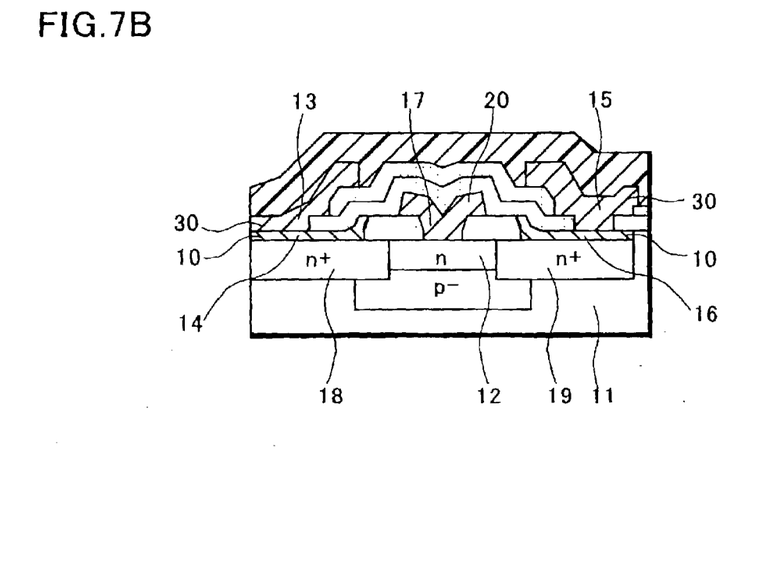
FIG. 7B is a partial cross-sectional view of the device of FIG. 7A.

FIG. 7A is an example of a semiconductor switching device integrated as a compound semiconductor chip based on the first embodiment of FIG. 2. FIG. 7B is a partial cross-sectional view of the chip of FIG. 7A cut along a line connecting points 7A and 7B of FIG. 7A perpendicularly to the channel layer of the FET. The two switching FETs (FET1 on the right, FET2 on the left) occupies the central portion of a GaAs substrate. A capacitor terminal C for connecting to the capacitor CA, the common input terminal IN and the control terminal Ctl are aligned along the upper edge of the substrate. The first and second output terminals OUT1, OUT2 and a ground terminal G for grounding FET2 are aligned along the lower edge of the substrate. The bias element for FET1 and the capacitor CA are externally connected to the chip as shown in FIG. 7A. The capacitor is inserted between the capacitor terminal C and the common input terminal IN, and the bias element is connected to the first output terminal OUT1. The dashed lines indicate a second layer of wiring which is formed in the same processing step as the gate electrodes of the FET and is made of a gate metal layer (Ti/Pt/Au) 20, as shown in FIG. 7B. A third layer of wiring indicated by the solid lines is for connecting the device elements and forming the terminal, and is made of a pad metal layer (Ti/Pt/Au) 30, as shown in FIG. 7B. A first layer contains an ohmic metal layer (AuGe/Ni/Au) 10 making an ohmic contact with the substrate, which forms the source electrode, the drain electrode and other terminals. In FIG. 7A, the first layer is not shown, as it overlaps with the pad metal layer.

FIG. 7B shows the placement of the three metal layers 10, 20, 30. The GaAs substrate 11 has an n-type channel region 12, and two heavily doped regions at both ends of the channel region 12, namely, a source region 18 and a drain region 19. The gate electrode 17, which is made of the gate metal layer 20 as the second metal layer, is formed on the surface of the channel region 12. The first layer drain electrode 14 and the first layer source electrode 16, which are made of the ohmic metal layer 10 as the first metal layer, are formed on the surface of the heavily doped regions. On top of the first-layer source and drain electrodes 14, 16 is formed the third layer source and drain electrode made of the pad metal layer 30 as the third metal layer, namely the third layer drain electrode 15 and the third layer source electrode 13. This layer is responsible for wiring the device elements of the chip.

Figure 8A:
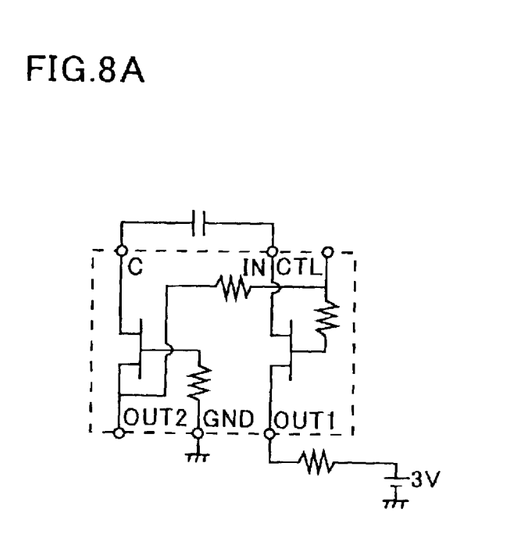
FIGS. 8A–8D show variations of the first embodiment.
Figure 8B:
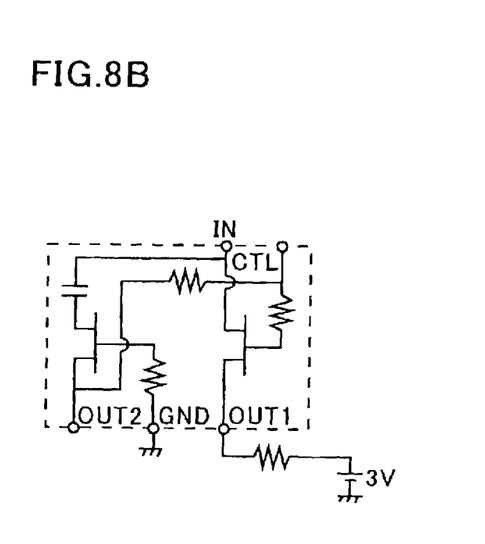
Figure 8C:
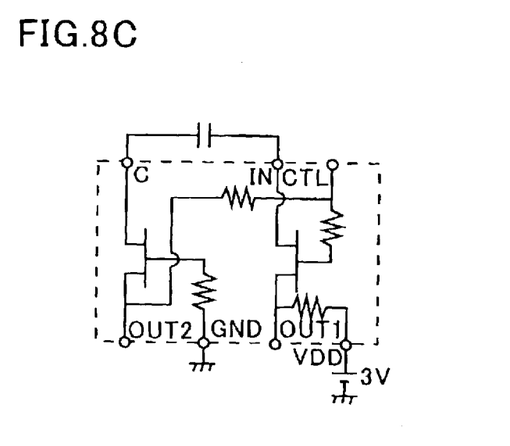
Figure 8D:
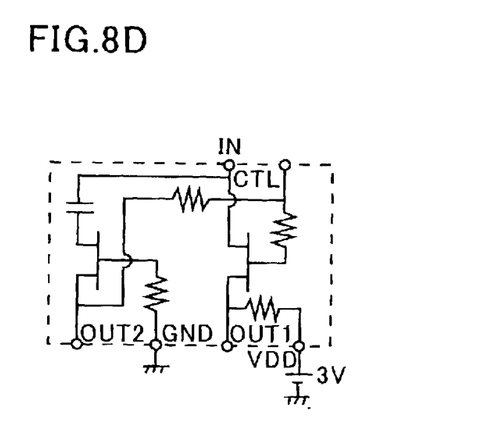

FIGS. 8A, 8B, 8C and 8D show variations of the first embodiment. The region denoted by the dotted line corresponds to a portion of the circuit which is integrated into the compound semiconductor substrate. The circuit elements outside of this region are externally connected to the chip portion. In the device of FIG. 8A, which corresponds to the device of FIG. 7A, the capacitor CA and the whole bias element including resistor Rc and the power source are externally connected to the chip portion. As a variation, the chip may include the capacitor CA (FIG. 8B), resistor Rc of the bias element (FIG. 8C), or both of the capacitor CA and resistor Rc (FIG. 8D).

Figure 9A:
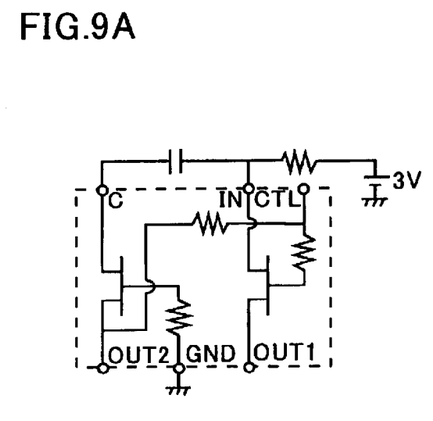
FIGS. 9A–9D show variations of a second embodiment of this invention.
Figure 9B:
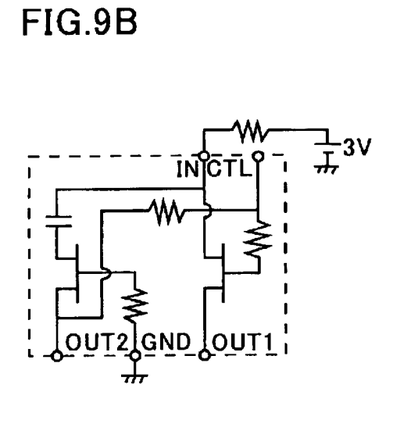
Figure 9C:
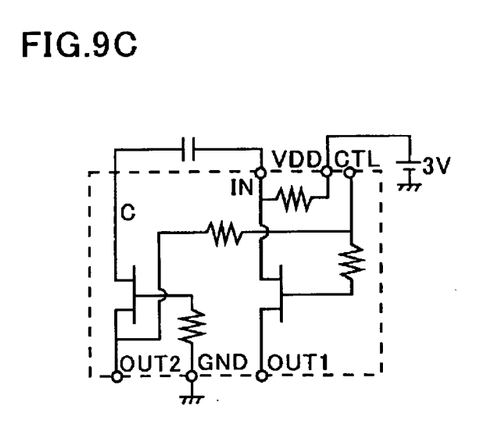
Figure 9D:
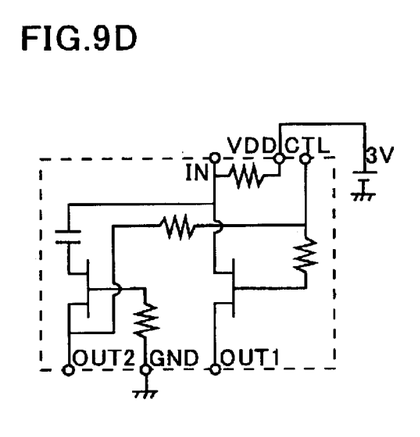

FIG. 9A shows a second embodiment of this invention in which the bias element applies the bias voltage to the common input terminal IN. FIGS. 9B, 9C and 9D show variations of the second embodiment of FIG. 9A. The region denoted by the dotted line corresponds to a portion of the circuit which is integrated into the compound semiconductor substrate. The circuit elements outside of this region are externally connected to the chip portion. In the device of FIG. 9A, the capacitor CA and the whole bias element including resistor Rc and the power source are externally connected to the chip portion. As a variation, the chip may include the capacitor CA (FIG. 9B), resistor Rc of the bias element (FIG. 9C), or both of the capacitor CA and resistor Rc (FIG. 9D).

Figure 10A:
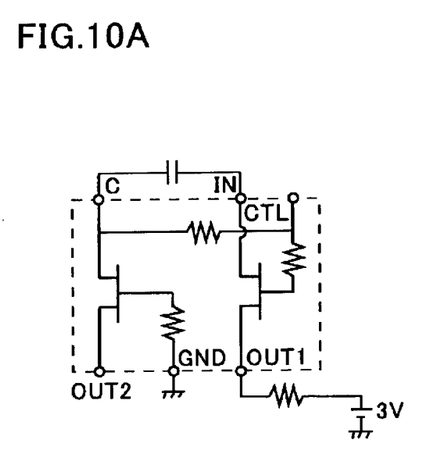
FIGS. 10A–10D show variations of a third embodiment of this invention.
Figure 10B:
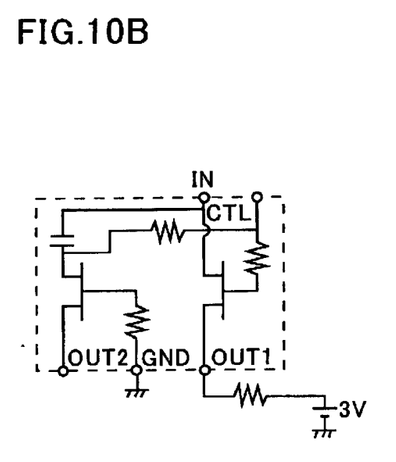
Figure 10C:
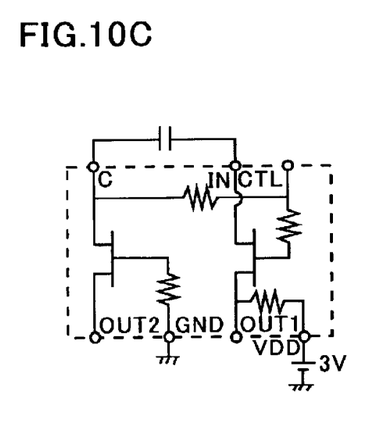
Figure 10D:
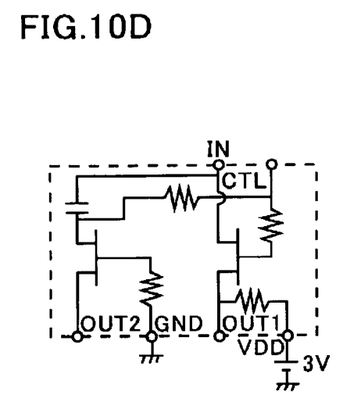

FIG. 10A shows a third embodiment of this invention in which the first connection extending from the control terminal Ctl connects with FET2 at its source side (or the drain side) which is not connected to the second output terminal OUT2. FIGS. 10B, 10C and 10D show the variations of the third embodiment of FIG. 10A. The region denoted by the dotted line corresponds to a portion of the circuit which is integrated into the compound semiconductor substrate. The circuit elements outside of this region are externally connected to the chip portion. In the device of FIG 10A, the capacitor CA and the whole bias element including resistor Rc and the power source are externally connected to the chip portion. As a variation, the chip may include the capacitor CA (FIG. 10B), resistor Rc of the bias element (FIG. 10C), or both of the capacitor CA and resistor Rc (FIG. 10D).

Figure 11A:
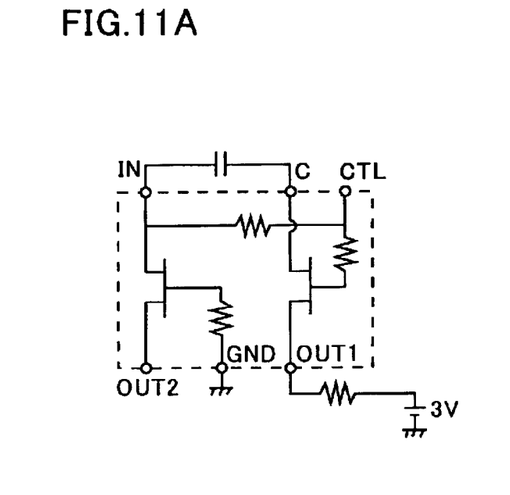
FIGS. 11A–11D show variations of a fourth embodiment of this invention.
Figure 11B:
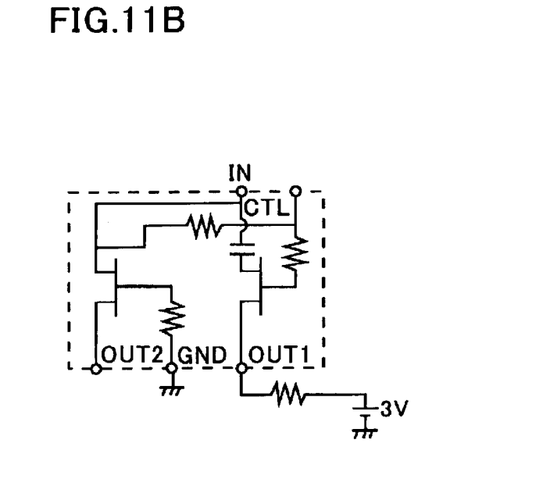
Figure 11C:
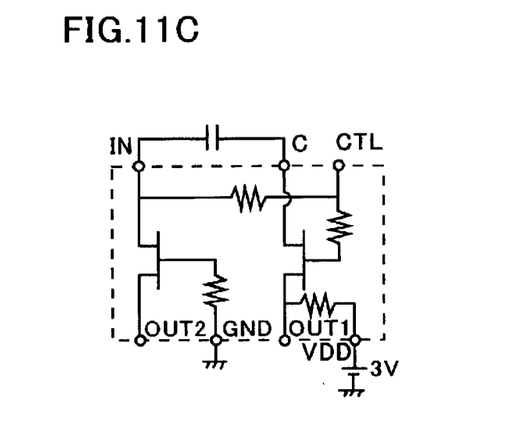
Figure 11D:
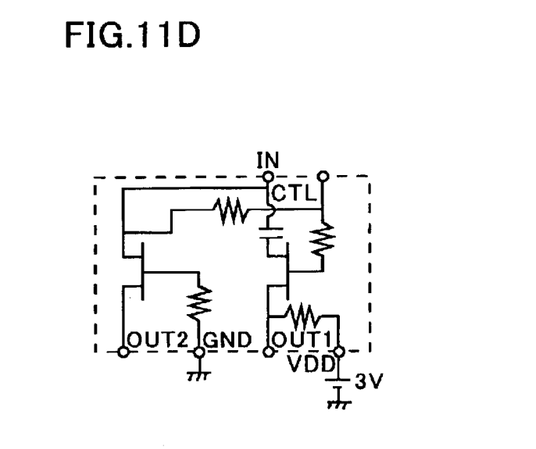

FIG. 11A shows a fourth embodiment of this invention in which the capacitor CA is connected between the common input terminal IN and FET1. FIGS. 10B, 10C and 10D show the variations of the fourth embodiment of FIG. 11A. The region denoted by the dotted line corresponds to a portion of the circuit which is integrated into the compound semiconductor substrate. The circuit elements outside of this region are externally connected to the chip portion. In the device of FIG. 11A, the capacitor CA and the whole bias element including resistor Rc and the power source are externally connected to the chip portion. As a variation, the chip may include the capacitor CA (FIG. 11B), resistor Rc of the bias element (FIG. 11C), or both of the capacitor CA and resistor Rc (FIG. 11D).

The above embodiments provide SPDT semiconductor switching circuit device based on GaAs FET which operates with just one control terminal without employing inverter circuits. Elimination of the external electrodes for the inverter circuits results in a simple package design and small occupancy of the printed circuit board. The energy consumption of the switching device is smaller than a device with inverter circuits.

Either a predetermined positive voltage or zero voltage is applied to the single control terminal for the switching operation. Thus, only one power source of positive voltage is required. There is no need for a negative voltage generating circuit which is required for operating GaAs FETs of conventional design. The insertion loss and isolation characteristics are substantially the same as for devices with two control terminals.

Although ground terminal GND and capacitor terminal C are required in the embodiments, the increase of chip area due to these additional terminals is compensated by reducing the number of the control terminal to one. Accordingly, the chip size of the embodiments is substantially the same as the conventional switching device. However, the switching device with one control terminal is very easy to handle when it is assembled into a host device, and thus helps simplifying production process.

The above is a detailed description of particular embodiments of the invention. It is recognized that departures from the disclosed embodiments may be made within the scope of the invention and that obvious modifications will occur to a person skilled in the art. The full scope of the invention is set out in the claims that follow and their equivalents. Accordingly, the specification should not be construed to narrow the full scope of protection to which the invention is entitled.

What is claimed is:

1. A switching circuit device comprising:

a common input terminal;

a first output terminal and a second output terminal;

a first switching element connected to the common input terminal and the first output terminal;

a second switching element connected to the common input terminal and the second output terminal;

a control terminal connected to the first switching element and receiving a control signal for the switching circuit device;

a first connection connecting the control terminal to the second switching element;

a second connection connecting the second switching element to a ground;

a bias element applying a bias voltage to the first switching element; and a direct current isolation element interrupting direct current between the first switching element and the common input terminal or between the second switching element and the common input terminal.

2. The switching circuit device of claim 1, wherein the bias voltage is a predetermined constant voltage and is constantly applied to the first switching element.

3. The switching circuit device of claim 2, wherein the predetermined constant voltage is positive.

4. The switching circuit device of claim 1, wherein the direct current isolation element comprises a capacitor.

5. The switching circuit device of claim 4, wherein the bias element comprises a resistor and a power source.

6. The switching circuit device of claim 5, wherein the capacitor or the resistor is formed on a substrate on which the first switching element and the second switching element are formed.

7. A semiconductor switching device comprising:

a first field effect transistor and a second field effect transistor each comprising a source electrode, a gate electrode and a drain electrode which are formed on a channel layer of the respective transistor;

a common input terminal connected to the source electrode or the drain electrode of the first transistor and connected to the source electrode or the drain electrode of the second transistor;

a first output terminal connected to the source electrode or the drain electrode of the first transistor which is not connected to the common input terminal;

a second output terminal connected to the source electrode or the drain electrode of the second transistor which is not connected to the common input terminal;

a control terminal connected to the gate electrode of the first transistor, said control terminal receiving a control signal for the switching device;

a bias element applying a bias voltage to the source electrode or the drain electrode of the first transistor;

a first connection connecting the control terminal to the source electrode or the drain electrode of the second transistor;

a second connection connecting the gate electrode of the second transistor to a ground; and a direct current isolation element interrupting direct current between the first transistor and the common input terminal or between the second transistor element and the common input terminal.

8. The semiconductor switching device of claim 7, wherein the bias voltage is a predetermined constant voltage and is constantly applied to the source electrode or the drain electrode of the first transistor.

9. The semiconductor switching device of claim 7, wherein the predetermined constant voltage is positive.

10. The semiconductor switching device of claim 7, wherein the direct current isolation element comprises a capacitor.

11. The semiconductor switching device of claim 7, wherein the gate electrode forms Schottky contact with the channel layer, and wherein the source electrode and the drain electrode form ohmic contact with the channel layer.

12. The semiconductor switching device of claim 7, wherein the first and second transistors are metal-semiconductor field-effect transistors.

13. The semiconductor switching device of claim 7, wherein the first and second transistors are formed on a substrate and integrated into one chip, and wherein the bias element and the direct current isolation element are externally connected to the chip.

14. The semiconductor switching device of claim 7, wherein the bias element comprises a resistor and a power source, and wherein the direct current isolation element comprises a capacitor.

15. The semiconductor switching device of claim 14, wherein the first and second transistors are formed on a substrate and integrated into one chip, and wherein the capacitor or the resistor is formed on the substrate.

* * * * *